(12) United States Patent
Kim et al.

(10) Patent No.: US 10,134,811 B2
(45) Date of Patent: Nov. 20, 2018

(54) IMAGE SENSORS HAVING LIGHT GUIDE MEMBERS

(71) Applicant: Samsung Electronics Co., Ltd., Suwon-si, Gyeonggi-do (KR)

(72) Inventors: Kyu Sik Kim, Yongin-si (KR); Satoh Ryuichi, Numazu-si (JP); Gae Hwang Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/592,686

(22) Filed: May 11, 2017

(65) Prior Publication Data

US 2017/0250226 A1   Aug. 31, 2017

Related U.S. Application Data

(62) Division of application No. 14/615,500, filed on Feb. 6, 2015, now Pat. No. 9,679,948.

(30) Foreign Application Priority Data

Aug. 18, 2014   (KR) .................. 10-2014-0107095

(51) Int. Cl.
*H01L 31/00* (2006.01)
*H01L 27/148* (2006.01)
(Continued)

(52) U.S. Cl.
CPC ...... *H01L 27/307* (2013.01); *H01L 27/14621* (2013.01); *H01L 27/14625* (2013.01); *H01L 27/14629* (2013.01); *H01L 27/286* (2013.01); *H01L 31/022475* (2013.01); *H01L 27/14627* (2013.01); *H01L 27/14645* (2013.01); *H01L 2251/306* (2013.01); *H01L 2251/308* (2013.01)

(58) Field of Classification Search
CPC .................. H01L 27/307; H01L 27/286; H01L 27/14629; H01L 27/14625; H01L 27/14621; H01L 31/022475; H01L 2251/308; H01L 2251/306; H01L 27/14627; H01L 27/14645; H01L 31/1013; H01L 27/144; H01L 27/146; H01L 27/305; H01L 31/00
See application file for complete search history.

(56) References Cited

U.S. PATENT DOCUMENTS 7,432,530 B2   10/2008   Yamashita et al.
7,732,745 B2   6/2010   Naya et al.
(Continued)

FOREIGN PATENT DOCUMENTS

JP   2010278272 A   12/2010

*Primary Examiner* — Su C Kim
(74) *Attorney, Agent, or Firm* — Harness, Dickey & Pierce, P.L.C.

(57) ABSTRACT

Image sensors include a color photo-sensing photoelectric conversion device, a first color filter and a second color filter disposed under the color photo-sensing photoelectric conversion device, a first photodiode and a second photodiode disposed under the first color filter and the second color filter, respectively, a first light guide member disposed between the first color filter and the first photodiode, and a second light guide member disposed between the second color filter and the second photodiode.

19 Claims, 6 Drawing Sheets

(51) Int. Cl.
*H01L 27/14* (2006.01)
*H01L 27/30* (2006.01)
*H01L 31/0224* (2006.01)
*H01L 27/28* (2006.01)
*H01L 27/146* (2006.01)

(56) References Cited

U.S. PATENT DOCUMENTS

| | | | |
|---|---|---|---|
| 2006/0113622 A1* | 6/2006 | Adkisson | H01L 21/76819 |
| | | | 257/443 |
| 2009/0046185 A1* | 2/2009 | Ota | H04N 5/23232 |
| | | | 348/294 |
| 2010/0102303 A1 | 4/2010 | Nomura et al. | |
| 2011/0019042 A1* | 1/2011 | Yamaguchi | H01L 27/14632 |
| | | | 348/280 |
| 2012/0156823 A1 | 6/2012 | Myung et al. | |
| 2012/0188419 A1 | 7/2012 | Lenchenkov | |
| 2012/0273907 A1 | 11/2012 | Lim | |
| 2013/0001730 A1 | 1/2013 | Miyanami | |
| 2013/0314576 A1 | 11/2013 | Suzuki et al. | |
| 2014/0070189 A1 | 3/2014 | Leem et al. | |

* cited by examiner

IMAGE SENSORS HAVING LIGHT GUIDE MEMBERS

RELATED APPLICATIONS

This application is a divisional of U.S. application Ser. No. 14/615,500, filed on Feb. 6, 2015, which claims priority to and the benefit, under 35 U.S.C. § 119, of Korean Patent Application No. 10-2014-0107095 filed in the Korean Intellectual Property Office on Aug. 18, 2014, the entire contents of each of which are incorporated herein by reference.

BACKGROUND

1. Field

Example embodiments relate to image sensors that perform photoelectric conversion of an image sensor used for a camera, a camcorder, and the like.

2. Description of the Related Art

A digital camera and a camcorder include an image sensor to store an electrical signal for an image, and the image sensor separates incident light into three primary colors of red, green, and blue and converts each of them into an electrical signal.

The image sensor filters one color of light including the three primary colors and senses the light by photoelectric conversion using a photodiode, or senses the light by using a photodiode reacting to one color of the three primary colors.

SUMMARY

Example embodiments relate to image sensors that perform photoelectric conversion of an image sensor used for a camera, a camcorder, and the like.

The image sensor is required to sense a small amount of light when the environmental brightness is low. For this, a loss of light before reaching the photodiode should be reduced.

However, because various thin films are stacked in an image sensor, and light is absorbed by the thin films and reflected at the interface between the thin films, light may be lost before reaching a photodiode. Therefore, a means to reduce light loss in an image sensor is required.

An image sensor according to example embodiments includes a color photo-sensing photoelectric conversion device, a first color filter and a second color filter disposed under the color photo-sensing photoelectric conversion device, a first photodiode and a second photodiode under the first color filter and the second color filter, respectively, a first light guide member disposed between the first color filter and the first photodiode, and a second light guide member between the second color filter the second photodiode.

The first and second light guide members, the first photodiode, and the second photodiode may be in a silicon substrate. The first and second light guide members may be formed substantially of a transparent material having a refractive index of about 1.8 to about 2.3 for light having a wavelength of 530 nm. The transparent material may include at least one selected from ITO (indium tin oxide), IZO (indium zinc oxide), a silicon oxide, a titanium oxide, a siloxane derivative, and a polyimide derivative.

The image sensor may further include a transmitting circuit portion under the silicon substrate.

The image sensor may further include an insulation member between the first color filter and the second color filter, between the first photodiode and the second photodiode, and around the light guide member, and a circuit wire within the insulation member. The first and second light guide members may be formed substantially of a transparent material having a refractive index of about 1.8 to about 2.3 for light having a wavelength of 530 nm.

A cross-section of the first and second light guide members may narrow going from the color photo-sensing photoelectric conversion device toward the first color filter or the second color filter.

The color photo-sensing photoelectric conversion device may convert green light, the first color filter may be a red light filter, and the second color filter may be a blue light filter.

The image sensor may further include a lens layer including a plurality of convex lenses on the color photo-sensing photoelectric conversion device and at a position corresponding to the first color filter and the second color filter.

An image sensor according to other example embodiments includes a color photo-sensing photoelectric conversion device, a first color photo-sensing photodiode and a second color photo-sensing photodiode under the color photo-sensing photoelectric conversion device, and a first light guide member between the color photo-sensing photoelectric conversion device and the first color photo-sensing photodiode.

The first color photo-sensing photodiode and the second color photo-sensing photodiode may overlap with each other.

The first color photo-sensing photodiode and the second color photo-sensing photodiode may each contact a surface of a silicon substrate.

The image sensor may further include an insulation member surrounding the first light guide member and disposed between the color photo-sensing photoelectric conversion device and the first and second color photo-sensing photodiodes, and a circuit wire within the insulation member. The first light guide member may be formed substantially of a transparent material having a refractive index of about 1.8 to about 2.3 for light having a wavelength of 530 nm.

A cross-section of the first light guide member may narrow going from the color photo-sensing photoelectric conversion device toward the first color photo-sensing photodiode or the second color photo-sensing photodiode.

The color photo-sensing conversion device may convert green light, the first color photo-sensing photodiode may sense red light, and the second color photo-sensing photodiode may sense blue light.

The image sensor may further include a lens layer including a plurality of convex lenses on the color photo-sensing photoelectric conversion device, and a second light guide member between the color photo-sensing photoelectric conversion device and the second color photo-sensing photodiode, wherein the plurality of convex lenses are each at a position corresponding to a respective one of the first and second light guide members.

The image sensor may further include a second light guide member between the color photo-sensing photoelectric conversion device and the second color photo-sensing photodiode, wherein the color photo-sensing photoelectric conversion device may include a plurality of first electrode each at a position corresponding to a respective one of the first and second light guide members, a second electrode extending over a region corresponding to the first and second of light guide members, and an organic semiconductor layer extending over the region corresponding to the first and second light guide members, and interposed between the first electrode and the second electrode. The plurality of first electrodes may each contact the respective one of the first and second light guide members, and a cross-section of each of the plurality of first electrodes narrows going toward the first and second light guide members.

An image sensor according to further example embodiments includes a silicon substrate including a blue photo-sensing silicon photodiode and a red photo-sensing silicon photodiode disposed in a depth direction, and a green photo-sensing organic photoelectric conversion layer on the silicon substrate, wherein the green photo-sensing organic photoelectric conversion layer includes, sequentially disposed from a light incidence side of the image sensor toward the blue photo-sensing silicon photodiode and the red photo-sensing silicon photodiode, a front side electrode, an organic semiconductor layer and a pixel electrode, the front side electrode and the pixel electrode each including a transparent conductive oxide, the silicon substrate and the blue and red photo-sensing silicon photodiodes collectively forming a front side irradiation CMOS device, and the pixel electrode is configured to guide light to a first light guide member for blue light and a second light guide member for red light in a dielectric layer over the front side irradiation CMOS device.

The first and second light guide members may include at least one of the pixel electrode and other materials having a refractive index of about 1.8 to about 2.3 for light having a wavelength of 530 nm, and the pixel electrode and the other materials may have a refractive index of about 1.9 to about 2.2. The pixel electrode and the other materials may have a refractive index difference within about 0.1. The pixel electrode may be formed substantially of include ITO, and the other materials may be formed substantially of a silicon nitride or a titanium oxide. The dielectric layer may be formed substantially of the silicon oxide.

The pixel electrode and the other materials may be consecutively disposed to form the light guide member.

An upper side of the pixel electrode may have a width two times or greater than a width of a bottom side of the first and second light guide members consisting of the other materials.

The image sensor may further include on-chip microlenses on the green photo-sensing organic photoelectric conversion layer, and a distance between the bottom side of the plurality of on-chip microlens and the upper side of the pixel electrode may be less than about 500 nm.

BRIEF DESCRIPTION OF THE DRAWINGS

Example embodiments will be more clearly understood from the following detailed description taken in conjunction with the accompanying drawings.

FIGS. 1 to 3 are cross-sectional views of image sensors according to some example embodiments.

FIG. 4 is a schematic view showing a process of guiding light in the light guide member of FIG. 3.

DETAILED DESCRIPTION

Figure 1:
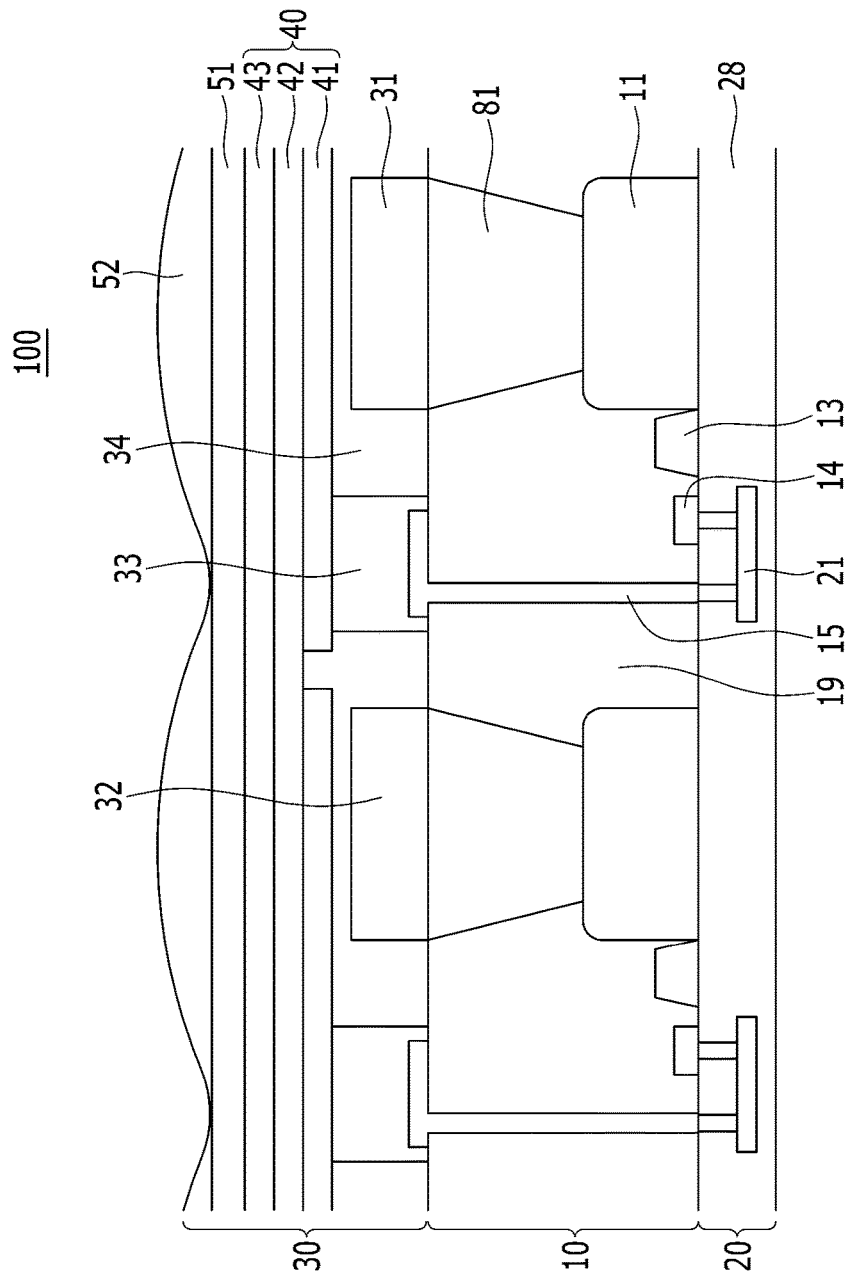
FIGS. 1-4 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Rather, these embodiments are provided so that this disclosure will be thorough and complete, and will fully convey the scope of the invention to those skilled in the art. Therefore, it should be understood that there is no intent to limit example embodiments to the particular forms disclosed, but on the contrary, example embodiments are to cover all modifications, equivalents, and alternatives falling within the scope.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification.

Example embodiments relate to image sensors that perform photoelectric conversion of an image sensor used for a camera, a camcorder, and the like.

FIG. 1 is a cross-sectional view of an image sensor according to some example embodiments.

Referring to FIG. 1, an image sensor 100 includes a substrate portion 10, a stacking portion 30 disposed on the substrate portion 10, and a transmitting circuit portion 20 disposed on the substrate portion 10.

The substrate portion 10 includes a silicon substrate 19, and a photodiode 11, a switching device 13 and a connecting portion 14 connected to a transmitting circuit wire 21 at the lower portion of the silicon substrate 19. The substrate portion 10 includes a plug 15 that passes through the silicon substrate 19 and connects the transmitting circuit wire 21 and a connecting electrode 33 of the stacking portion 30. The substrate portion 10 includes a light guide member 81 disposed directly on the photodiode 11. Herein, the photodiode 11 is a device that functions to receive light and photo-convert it into an electrical signal, and may be a CMOS (complementary metal-oxide semiconductor) device. The switching device 13 controls transmission of the electrical signal generated in the photodiode 11 to the transmitting circuit wire 21. The switching device 13 is connected to the transmitting circuit wire 21 through the connecting portion 14. The light guide member 81 guides incident light that transmits through color filters 31 and 32 into the photodiode 11 without loss. The light guide member 81 is made of a material having a greater refractive index than that of the silicon substrate 19, and thus guides light into the photodiode 11 by total reflection. The light guide member 81 is made of a transparent material having a refractive index of about 1.8 to about 2.3 for light of 530 nm wavelength region as a main material. The light guide member 81 may be formed of a material of ITO (indium tin oxide), IZO (indium zinc oxide), a silicon oxide, a titanium oxide, a siloxane derivative, a polyimide derivative, and the like as a main material. The light guide member 81 may have a narrower cross-section (as a truncated pyramid) going from the color filters 31 and 32 to the photodiode 11. However, the light guide member 81 may have a cylinder shape such as a circular cylinder, a quadrangled cylinder, and the like, which have the same cross-section at the top and the bottom.

The stacking portion 30 includes a red color filter 31 and a blue color filter 32 respectively disposed at a position corresponding to a light guide member 81, a connecting electrode 33 contacting the plug 15, a green photo-sensing organic material photoelectric conversion device 40 disposed on the color filters 31 and 32 and the connecting electrode 33, a protective layer 51 covering the green photo-sensing organic material photoelectric conversion device 40, and a lens layer 52 disposed on the protective layer 51. An insulating material 34 is filled in the space between the color filters 31 and 32 and the green photo-sensing organic material photoelectric conversion device 40. The insulating material 34 may be an organic insulating material or an inorganic insulating material. The color filters 31 and 32 are respectively disposed at positions contacting the light guide members 81, and light transmitting through the color filters 31 and 32 is guided to the light guide members 81. The green photo-sensing organic material photoelectric conversion device 40 includes a first electrode 41, a second electrode 43, and an organic semiconductor layer 42 interposed between the electrodes 41 and 43. The organic semiconductor layer 42 includes a material that functions for selective photoelectric conversion of green light. The first electrode 41 is separated for each color region, and is electrically connected to the connecting electrode 33. The second electrode 43 is integrally formed over the entire sensor. The first electrode 41 and the second electrode 43 may consist of a transparent conductive material of ITO or IZO and the like. The connecting electrode 33 electrically connects the first electrode 41 of the green photo-sensing organic material photoelectric conversion device 40 and the plug 15, and also acts as a light blocking member. The lens layer 52 may include a plurality of convex lenses disposed at each position corresponding to the color filters 31 and 32.

The transmitting circuit portion 20 includes the transmitting circuit wire 21 in an insulation (or dielectric) member 28. The transmitting circuit wire 21 is connected to the photodiode 11 through the connecting portion 14, and is connected to the green photo-sensing organic material photoelectric conversion device 40 through the plug 15. The transmitting circuit wire 21 transmits an electrical signal that is converted by the photodiode 11 and the green photo-sensing organic material photoelectric conversion device 40 to a memory (not shown) or a data processor (not shown). The insulation member 28 may consist of a plurality of insulation layers. The transmitting circuit portion 20 may be formed by attaching a separate substrate including a circuit to the substrate portion 10, or by stacking a wire layer and an insulation layer under the substrate portion 10.

In the image sensor of such a structure, light transmitting through the green photo-sensing organic material photoelectric conversion device 40 transmits through the color filters 31 and 32, and only red light and blue light remain, and the red light and blue light enter the light guide members 81 beneath the color filters 31 and 32. The red light and blue light incident into the light guide member 81 is guided to the photodiode 11 by total reflection at the boundary between the light guide member 81 and the silicon substrate 19 without deviating from the light guide member 81. Therefore, light loss from the color filters 31 and 32 to the photodiode 11 is minimized, improving sensitivity of an image sensor.

In the example embodiments of FIG. 1, the combination of the green photo-sensing organic material photoelectric conversion device 40 and the red color filter 31 and the blue color filter 32 is illustrated, but other combinations are possible. For example, a red photo-sensing organic material photoelectric conversion device and a green color filter and blue color filter may be used, or alternatively, a blue photo-sensing organic material photoelectric conversion device and a red color filter and green color filter may be used.

Figure 2:
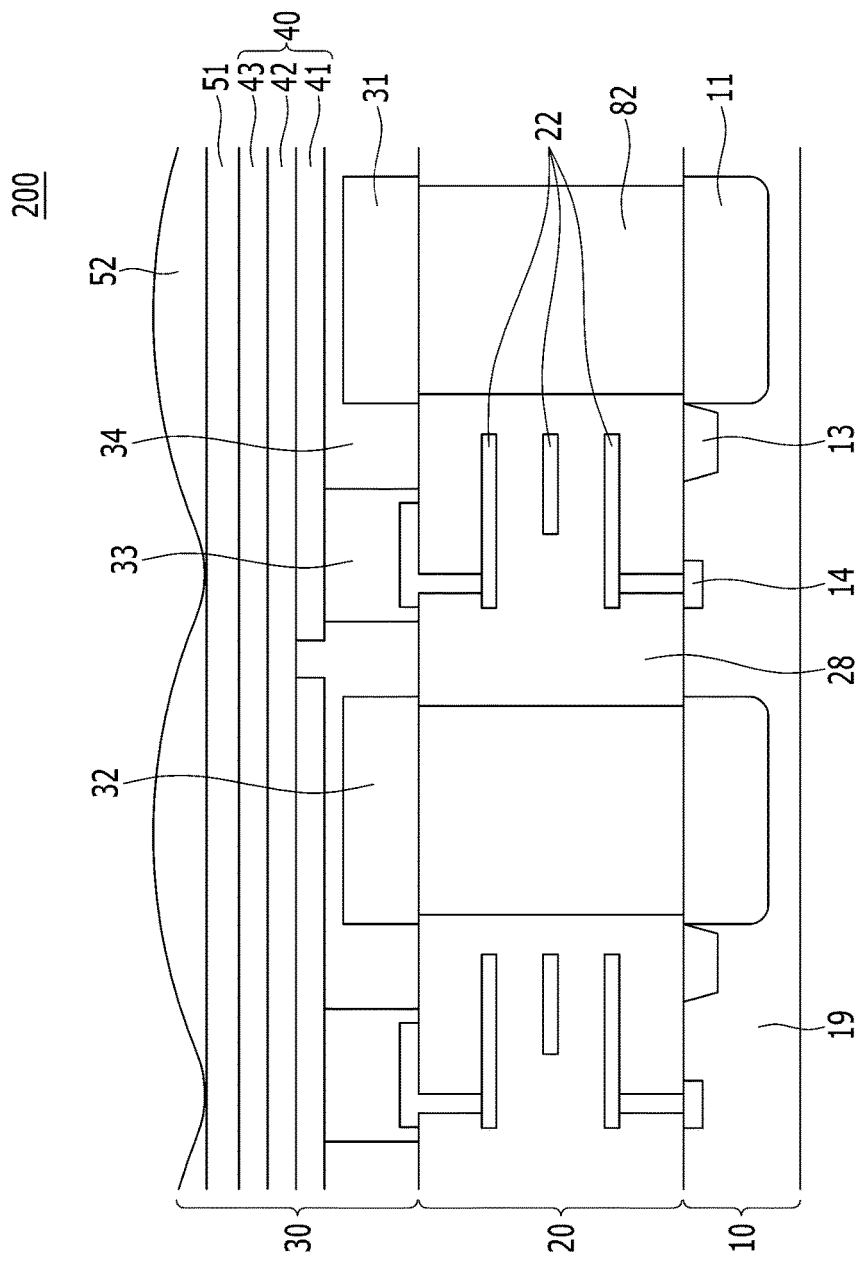

FIG. 2 is a cross-sectional view of an image sensor according to other example embodiments.

Referring to FIG. 2, an image sensor 200 includes a substrate portion 10, a transmitting circuit portion 20 disposed on the substrate portion 10, and a stacking portion 30 disposed on the transmitting circuit portion 20.

The substrate portion 10 includes a photodiode 11, a switching device 13, and a connecting portion 14. The photodiode 11, the switching device 13, and the connecting portion 14 are formed on a silicon substrate 19. Herein, the photodiode 11 is a device that receives light and photo-converts it into an electrical signal, and may be a CMOS (complementary metal-oxide semiconductor) device. The switching device 13 controls transmission of the electrical signal generated in the photodiode 11 to a transmitting circuit wire 22. The connecting portion 14 is a connecting pad that connects the switching device 13 to the transmitting circuit wire 22.

The transmitting circuit portion 20 includes the transmitting circuit wire 22, a light guide member 82, and an insulation (or dielectric) member 28. The transmitting circuit wire 22 is connected to the photodiode 11 through the connecting portion 14, and is also connected to a green photo-sensing organic material photoelectric conversion device 40. The transmitting circuit wire 22 transmits an electrical signal that is converted by the photodiode 11 and the green photo-sensing organic material photoelectric conversion device 40 to a memory (not shown) or a data processor (not shown). The light guide member 82 guides incident light that transmits through color filters 31 and 32 into the photodiode 11 without loss. The light guide member 82 is made of a material having a greater refractive index than that of the insulation member 28, and thus guides light into the photodiode 11 by total reflection. The light guide member 82 may be formed of a transparent material having a refractive index of about 1.8 to about 2.3 for light of 530 nm wavelength as a main material. The light guide member 81 may be formed of a material of ITO (indium tin oxide), IZO (indium zinc oxide), a silicon oxide, a titanium oxide, a siloxane derivative, a polyimide derivative, and the like as a main material. The light guide member 82 may have a cross-section having the same top and bottom shape such as a circular cylinder, a quadrangled cylinder, and the like. However, the light guide member 82 may have a narrower cross-section (as a truncated pyramid) going from the color filters 31 and 32 to the photodiode 11. The insulation member 28 may consist of a plurality of insulation layers, and insulates between wire layers of the transmitting circuit wire 22 consisting of a plurality of wire layers.

The stacking portion 30 includes a red color filter 31 and a blue color filter 32 disposed at a position corresponding to the light guide member 82, a connecting electrode 33 contacting the transmitting circuit wire 22, the green photo-sensing organic material photoelectric conversion device 40 disposed on the color filters 31 and 32 and the connecting electrode 33, a protective layer 51 covering the green photo-sensing organic material photoelectric conversion device 40, and a lens layer 52 disposed on the protective layer 51. An insulating material 34 is filled in the space between the color filters 31 and 32 and the green photo-sensing organic material photoelectric conversion device 40. The insulating material 34 may be an organic insulating material or an inorganic insulating material. The color filters 31 and 32 are respectively disposed at positions contacting the light guide members 82, and light transmitting through the color filters 31 and 32 is guided to the light guide members 82. The green photo-sensing organic material photoelectric conversion device 40 includes a first electrode 41, a second electrode 43, and an organic semiconductor layer 42 interposed between the electrodes 41 and 43. The organic semiconductor layer 42 includes a material that functions for selective photoelectric conversion of green light. The first electrode 41 is separated for each color region, and is electrically connected to the connecting electrode 33. The second electrode 43 is integrally formed through the sensor. The first electrode 41 and the second electrode 43 may consist of a transparent conductive material of ITO or IZO and the like. The connecting electrode 33 electrically connects the first electrode 41 of the green photo-sensing organic material photoelectric conversion device 40 and the transmitting circuit wire 22, and also acts as a light blocking member. The lens layer 52 may include a plurality of convex lenses disposed at each position corresponding to the color filters 31 and 32.

In the image sensor having such a structure, the light guide member 82 minimizes light loss from the color filters 31 and 32 to the photodiode 11, improving sensitivity of an image sensor.

In the example embodiments of FIG. 2, the combination of the green photo-sensing organic material photoelectric conversion device 40 and the red color filter 31 and the blue color filter 32 is illustrated, but other combinations are possible. For example, a red photo-sensing organic material photoelectric conversion device and a green color filter and blue color filter may be used, or alternatively, a blue photo-sensing organic material photoelectric conversion device and a red color filter and green color filter may be used.

Figure 3:
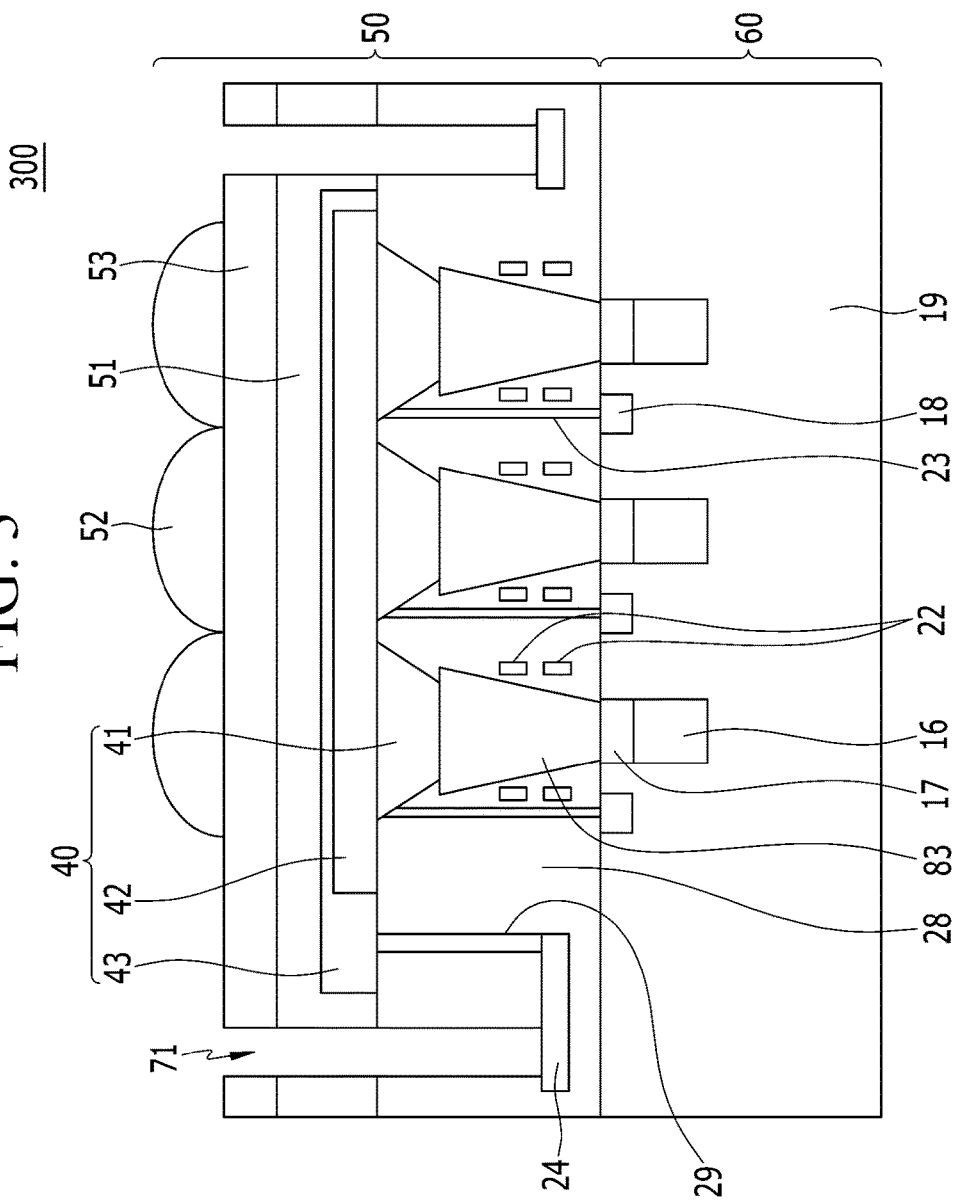
Figure 4:
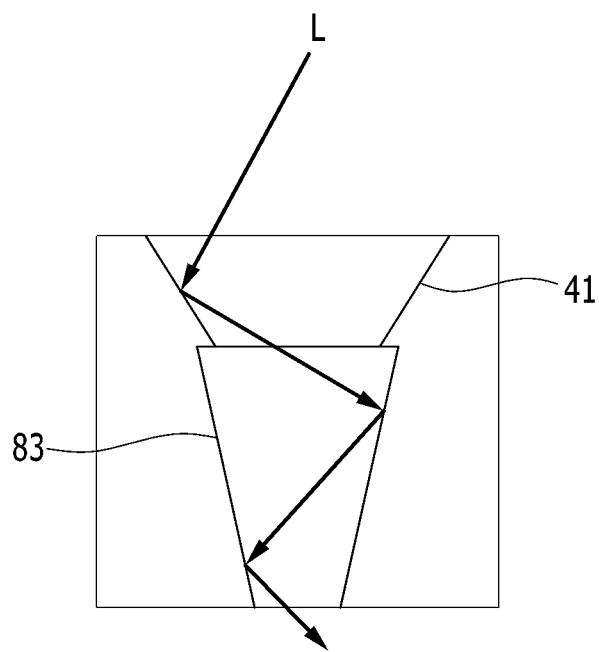

FIG. 3 is a cross-sectional view of an image sensor according to still other example embodiments, and FIG. 4 is a schematic view showing a process of guiding light L in the light guide member of FIG. 3.

Referring to FIG. 3, an image sensor 300 includes a substrate portion 60 and a stacking portion 50.

The substrate portion 60 includes a silicon substrate 19, a blue photo-sensing photodiode 17 and a red photo-sensing photodiode 16 disposed on (or within) the silicon substrate 19, and a control electrode 18. The blue photo-sensing photodiode 17 performs photoelectric conversion for light in a blue wavelength region to generate an electrical signal, and the red photo-sensing photodiode 16 performs photoelectric conversion for light in a red wavelength region to generate an electrical signal. In the example embodiments of FIG. 3, the blue photo-sensing photodiode 17 may overlap with the red photo-sensing photodiode 16.

Figure 5:
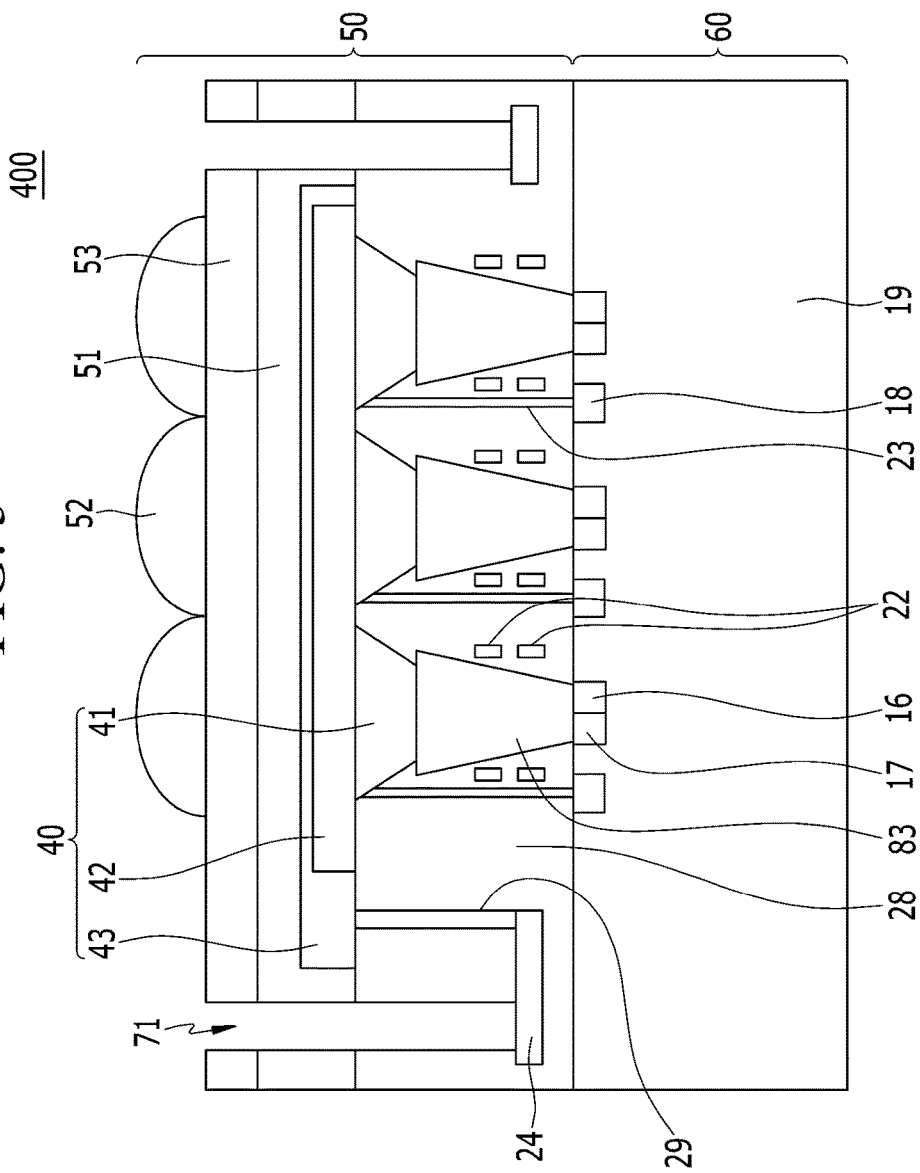
FIGS. 5 and 6 are cross-sectional views of image sensors according to other example embodiments.
Figure 6:
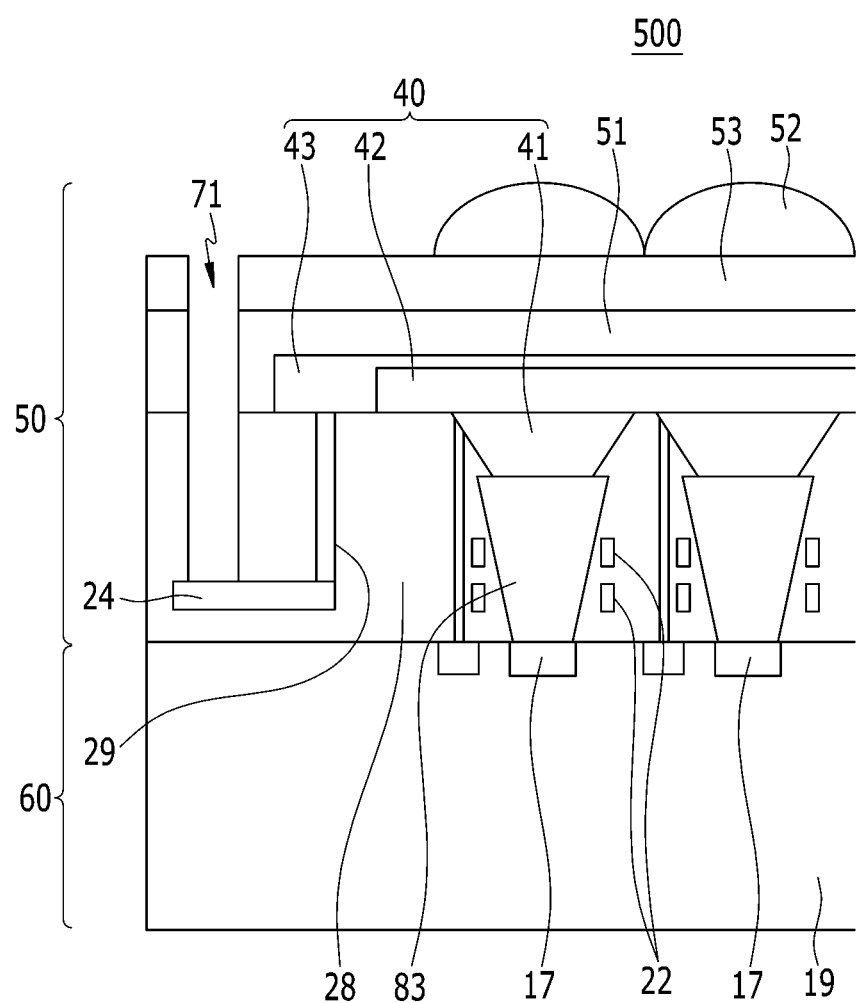

However, according to other example embodiments, the blue and red photo-sensing photodiodes 17 and 16 may be disposed at the same height so as to be adjacent to each other. As shown in FIG. 5, in an image sensor 400 according to further example embodiments, the blue photo-sensing photodiode 17 and the red photo-sensing photodiode 16 may be formed to each contact the surface of the silicon substrate 19. As shown in FIG. 6, in an image sensor 500 according to even further example embodiments, each of the blue photo-sensing photodiode 17 and the red photo-sensing photodiode 16 may be disposed at the position corresponding to each light guide member 83. According to further example embodiments, the blue photo-sensing photodiode 17 and the red photo-sensing photodiode 16 in the silicon substrate 19 may be a front side irradiation complementary metal-oxide semiconductor (CMOS) device.

The control electrode 18 is connected to the green photo-sensing organic material photoelectric conversion device 40 through a plug 23, and controls transmission of the generated electrical signal of the green photo-sensing organic material photoelectric conversion device 40 to a memory or a data processor.

The stacking portion 50 includes an insulation member 28 including a plurality of insulation layers, a transmitting circuit wire 22 surrounded by the insulation member 28, a light guide member 83, a green photo-sensing organic material photoelectric conversion device 40 including a first electrode 41, a second electrode 43, and an organic semiconductor layer 42 interposed between the electrodes 41 and 43, a first plug 23 electrically connecting the first electrode 41 of the green photo-sensing organic material photoelectric conversion device 40 to the control electrode 18 of the substrate portion 60, a connecting pad 24 exposed through a contact hole 71, a second plug 29 connecting the connecting pad 24 and the second electrode 43 of the green photo-sensing organic material photoelectric conversion device 40, a protective layer 51 covering the green photo-sensing organic material photoelectric conversion device 40, an interlayer insulating layer 53 disposed on the protective layer 51, and a lens layer 52 disposed on the interlayer insulating layer 53. The lens layer 52 may include a plurality of convex lenses disposed at each position corresponding to the light guide member 83. The lens layer 52 may include on-chip microlenses, and a distance between the bottom side of the lens layer 52 and the upper side of the first electrode 41 may be less than about 500 nm.

The first electrode 41 and the light guide member 83 of the green photo-sensing organic material photoelectric conversion device 40 may have a narrower cross-section (as a truncated pyramid) going toward to the silicon substrate 19. However, the first electrode 41 and the light guide member 83 may have a cross-section having the same upper and bottom shape such as a cylinder, a hexagon, and the like. The light guide member 83 is made of a material having a greater refractive index than that of the insulation member 28, and thus guides light into the photodiodes 16 and 17 by total reflection. The insulation member 28 may consist of a silicon oxide, and the light guide member 83 may be formed of a transparent material having a refractive index of about 1.8 to about 2.3 for light of 530 nm wavelength as a main material. The light guide member 83 may be formed of a material of ITO (indium tin oxide), IZO (indium zinc oxide), a silicon oxide, a titanium oxide, a siloxane derivative, a polyimide derivative, and the like as a main material. The first electrode 41 and the second electrode 43 may consist of a transparent conductive material of ITO or IZO and the like. In the present example embodiments, the first electrode 41 of the green photo-sensing organic material photoelectric conversion device 40 guides light. Herein, the refractive index of the first electrode 41 and the light guide member 83 may be about 1.9 to about 2.2, and a refractive index difference between the first electrode 41 and the light guide member 83 is within 0.1. The upper side of the first electrode 41 may have a width that is twice or more that of the bottom side of the light guide member 83. As shown in FIG. 4, the light guide member 83 guides incident light that transmits through the organic semiconductor layer 42 to the first electrode 41 by total reflection, and the light is guided to the photodiodes 17 and 16 by the light guide member 83.

In the image sensor having such a structure, the first electrode 41 and the light guide member 83 minimize light loss and guide light to the photodiodes 16 and 17, improving sensitivity of an image sensor.

In the example embodiments of FIG. 3, the green photo-sensing organic material photoelectric conversion device 40 is disposed at an upper side of the stacking portion 50, and light transmitting through the same is provided to the red photo-sensing photodiode 16 and the blue photo-sensing photodiode 17, but other combinations are possible. For example, a red photo-sensing organic material photoelectric conversion device may be disposed at an upper side, and light transmitting through the same is provided to the green photo-sensing photodiode and blue photo-sensing photodiode, or alternatively, a blue photo-sensing organic material photoelectric conversion device may be disposed at an upper side, and light transmitting through the same is provided to the green photo-sensing photodiode and red photo-sensing photodiode.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 10: substrate portion | 20: transmitting circuit portion |
| 30: stacking portion | 11: photodiode |
| 40: green photo-sensing organic material photoelectric conversion device | |
| 19: silicon substrate | 17: blue photo-sensing photodiode |
| 16: red photo-sensing photodiode | 31, 32: color filter |
| 13: switch | 21, 22: transmitting circuit wire |
| 81, 82, 83: light guide member | 41, 43: electrode |
| 51: protective layer | |
| 52: lens layer | |

What is claimed is:

1. An image sensor, comprising:
   a color photo-sensing photoelectric conversion device;
   a plurality of first color photo-sensing photodiodes and a plurality of a second color photo-sensing photodiodes under the color photo-sensing photoelectric conversion device; and
   a plurality of light guide members between the color photo-sensing photoelectric conversion device and at least one of the plurality of first color photo-sensing photodiodes and the plurality of second color photo-sensing photodiodes, wherein
   the color photo-sensing photoelectric conversion device includes a plurality of first electrodes a second electrode, the plurality of first electrode each at a position corresponding to a respective one of the plurality of light guide members, and the second electrode extending over a region corresponding to the plurality of light guide members,
   each of the plurality of first electrodes contact the respective one of the plurality of light guide members, and a cross-section of each of the plurality of first electrodes narrows going towards the respective one of the plurality of light guide members.

2. The image sensor of claim 1, wherein one of the plurality of the first color photo-sensing photodiodes and one of the plurality of the second color photo-sensing photodiodes overlap with each other.

3. The image sensor of claim 1, wherein one of the plurality of the first color photo-sensing photodiodes and one of the plurality of the second color photo-sensing photodiodes each contact a surface of a silicon substrate.

4. The image sensor of claim 1, wherein the plurality of the first color photo-sensing photodiodes and the plurality of the second color photo-sensing photodiodes are in a silicon substrate.

5. The image sensor of claim 1, further comprising:
an insulation member surrounding the light guide member and disposed between the color photo-sensing photoelectric conversion device and the first and second color photo-sensing photodiodes; and
a circuit wire within the insulation member.

6. The image sensor of claim 5, wherein the light guide member is formed substantially of a transparent material having a refractive index of about 1.8 to about 2.3 for light having a wavelength of 530 nm.

7. The image sensor of claim 1, wherein a cross-section of the light guide member narrows going from the color photo-sensing photoelectric conversion device toward one of the plurality of the first color photo-sensing photodiodes or one of the plurality of the second color photo-sensing photodiodes.

8. The image sensor of claim 1, wherein
the color photo-sensing photoelectric conversion device is configured to convert green light,
the plurality of the first color photo-sensing photodiodes respectively senses red light, and
the plurality of the second color photo-sensing photodiodes respectively senses blue light.

9. The image sensor of claim 1, further comprising:
a lens layer including a plurality of convex lenses on the color photo-sensing photoelectric conversion device, wherein
the plurality of convex lenses are each at a position corresponding to a respective one of the plurality of light guide members.

10. The image sensor of claim 1, wherein
an organic semiconductor layer extending over the region corresponding to the plurality of guide members, and interposed between the first electrode and the second electrode.

11. An image sensor, comprising:
a silicon substrate including a plurality of blue photo-sensing silicon photodiodes and a plurality of red photo-sensing silicon photodiodes disposed in a depth direction; and
a green photo-sensing organic photoelectric conversion layer on the silicon substrate, wherein
the green photo-sensing organic photoelectric conversion layer includes, sequentially disposed from a light incidence side of the image sensor toward the plurality of blue photo-sensing silicon photodiodes and the plurality of red photo-sensing silicon photodiodes, a front side electrode, an organic semiconductor layer, and a plurality of pixel electrode,
the front side electrode and the pixel electrode each include a transparent conductive oxide,
the silicon substrate, the plurality of blue photo-sensing silicon photodiodes and the plurality of red photo-sensing silicon photodiodes collectively form a front side irradiation CMOS device,
the plurality of pixel electrodes are configured to guide light to each of a plurality of light guide members for blue light and red light in a dielectric layer over the front side irradiation CMOS device, and
a cross-section of the each of the plurality of pixel electrodes narrows going toward a respective one of the plurality of light guide members.

12. The image sensor of claim 11, wherein the plurality of light guide members include at least one of the plurality of pixel electrodes and other materials having a refractive index of about 1.8 to about 2.3 for light having a wavelength of 530 nm.

13. The image sensor of claim 12, wherein the plurality of pixel electrodes and the other materials have a refractive index of about 1.9 to about 2.2.

14. The image sensor of claim 13, wherein the plurality of pixel electrodes and the other materials have a refractive index difference within about 0.1.

15. The image sensor of claim 12, wherein the plurality of pixel electrodes are formed substantially of includes ITO, and
the other materials are formed substantially of a silicon nitride or a titanium oxide.

16. The image sensor of claim 15, wherein the dielectric layer is formed substantially of a silicon oxide.

17. The image sensor of claim 12, wherein one of the plurality of pixel electrodes and the other materials are consecutively disposed to form the plurality of light guide members.

18. The image sensor of claim 12, wherein an upper side of one of the plurality of pixel electrodes has a width two times or greater than a width of a bottom side of the one of the plurality of light guide members consisting of the other materials.

19. The image sensor of claim 11, further comprising:
a plurality of on-chip micro-lenses on the green photo-sensing organic photoelectric conversion layer,
wherein a distance between a bottom side of the plurality of on-chip micro-lenses and an upper side of one of the plurality of pixel electrodes is less than about 500 nm.

\* \* \* \* \*